United States Patent [19]

Kaji et al.

[11] 4,073,054

[45] Feb. 14, 1978

[54] METHOD OF FABRICATING SEMICONDUCTOR DEVICE

[75] Inventors: Tadao Kaji, Tokyo; Yoshio Homma, Hachioji, both of Japan

[73] Assignee: Hitachi, Ltd., Japan

[21] Appl. No.: 714,197

[22] Filed: Aug. 13, 1976

[30] Foreign Application Priority Data

Aug. 25, 1975    Japan .................................. 50-102181

[51] Int. Cl.² ............................................ B01J 17/00
[52] U.S. Cl. ......................................... 29/580; 29/588; 204/192 E; 357/49
[58] Field of Search ................... 29/576 IW, 580, 578, 29/588; 204/192 E; 357/49

[56] References Cited

U.S. PATENT DOCUMENTS

| | | | |
|---|---|---|---|
| 3,400,309 | 9/1968 | Doo | 29/576 IW |
| 3,892,608 | 7/1975 | Kuhn | 357/49 |
| 3,998,673 | 12/1976 | Chow | 29/580 |

OTHER PUBLICATIONS

IBM Technical Disclosure Bulletin, "Double Poly-Silicon Isolation for IC", by Doo, vol. 8, No. 5, Oct. 1965, pp. 802 and 803.

*Primary Examiner*—W. Tupman
*Attorney, Agent, or Firm*—Craig & Antonelli

[57] ABSTRACT

An improved method for forming an isolation region of electrical insulator between elements of a semiconductor device, comprising depositing an electrical insulator at a low temperature to cover one major surface of a semiconductor substrate and to fill a groove provided in this surface of the semiconductor substrate, coating the electrical insulator layer with another electrical insulator which is etched at a rate approximately equivalent to that of the former electrical insulator, so as to make the entire top surface of the electrical insulator layer parallel to the major surface of the substrate, and then applying physical etching using ions to remove the electrical insulator layers until the surface of the substrate is exposed, whereby to provide in the groove an isolation region having a satisfactory surface flatness.

1 Claim, 19 Drawing Figures

METHOD OF FABRICATING SEMICONDUCTOR DEVICE

BACKGROUND OF THE INVENTION

1. Field of the Invention

This invention relates to a method of fabricating a semiconductor device or semiconductor integrated circuit device, and more particularly to a method for providing isolation between elements of such a device using an oxide.

2. Description of the Prior Art

An isoplanar technique is disclosed in, for example, U.S. Ser. No. 111,956 filed on Feb. 2, 1971 by Fairchild Camera and Instrument Corporation. Such isoplanar technique is known as an effective method for providing isolation between elements of a semiconductor device or semiconductor integrated circuit device, and an oxide of electrical insulator is used for the isolation. This method is advantageous over a known method for element isolation utilizing a PN junction in that the parasitic capacitance can be reduced, the mask alignment can be achieved with reduced error, etc.

However, due to the fact that this method utilizes an oxide layer formed by thermal oxidation of an electrical insulator on a semiconductor substrate of the isolation between elements of a semiconductor device or semiconductor integrated circuit device, a projecting area or a so-called bird beak or bird head tends to appear the oxide layer giving rise to such a trouble that a conductor layer deposited subsequently on this oxide layer tends to be disconnected in the vicinity of the bird beak or bird head. Futher, this method has such a disadvantage that crystal distortion adversely affecting the elctrical properties of the divice tends to occur due to the fact that the semiconductor substrates exposed to a high temperature over a long period of time during the formation of the oxide.

SUMMARY OF THE INVENTION

It is an object of the present invention to provide an improved method of the kind above described which can provide an isolation oxide region which has a very good surface flatness free from any bird beak or bird head.

Another object of the present invention is to provide an improved method of the kind above described which eliminates occurrence of crystal distortion in a semiconductor substrate during fabrication of a semiconductor device or semiconductor integrated circuit device.

The present invention is featured by the fact that an electrical insulator is deposited at a low temperature on one major surface of a semiconductor substrate to fill a groove provided in the said substrate surface and is subsequently covered with another electrical insulator which is etched at a rate approximately equivalent to that of the former electrical insulator layer, and then physical etching using ions is applied to remove these insulator layers until the surface of the semiconductor substrate, is exposed.

DESCRIPTION OF THE PREFERRED EMBODIMENTS

Figure 1A:
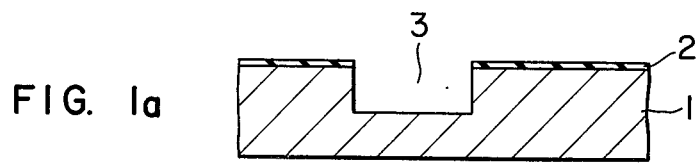
FIGS. 1a to 1d are schematic sectional views of part of a semiconductor substrate showing successive fabricating steps of an embodiment of the method according to the present invention when used for the fabrication of a semiconductor device.
Figure 1B:
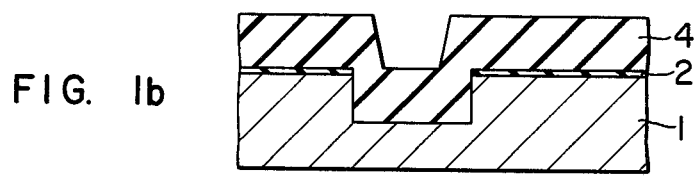
Figure 1C:
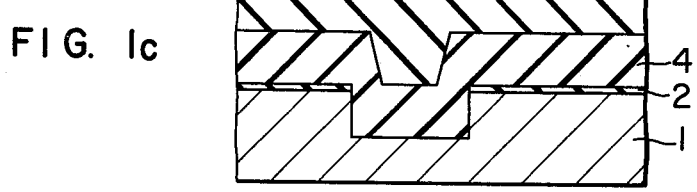

FIGS. 1a to 1d show schematically the basic fabricating process of the present invention. Referring to FIG. 1a, a groove 3 is selectively provided in one major surface of a semiconductor substrate 1 of, for example, silicon by a known photo-etching technique in which an oxide layer 2 having a thickness of 5000A preformed on the surface of the semiconductor substrate 1 by oxidation is used as a mask. Then, as shown in FIG. 1b, an electrical insulating layer 4 of suitable material, for example, an $SiO_2$ layer having a thickness of $1.5 - 2\mu$ is deposited as by chemical vapor deposition (CVD) at a temperature of about 400° C on the semiconductor substrate 1 to cover the substrate surface and to fill the groove 3 provided in the major surface of the semiconductor substrate 1. Subsequently, as shown in FIG. 1c, a layer 5 of PIQ (Polyimide-iso-indroquinazolinedione) resins having a thickness of $1.5 - 2\mu$ is coated on the $SiO_2$ layer 4 so as to make the entire top surface of the PIQ layer parallel to the major surface of the substrate.

Figure 1D:
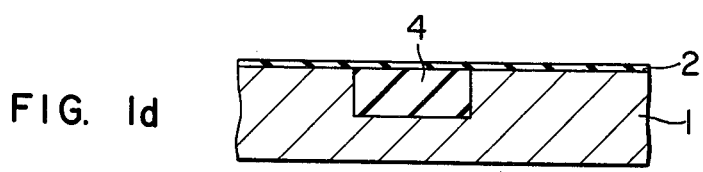

Then, the PIQ resin layer 5 and the CVD-$SiO_2$ layer 4 are successively uniformly etched away from the side of the surface of the PIQ resin layer 5 as by rf-sputtering under the conditions of Ar 20cc/min and $5 \times 10^{-3}$ Torr. Thus, as shown in FIG. 1d, a portion of the CVD-$SiO_2$ layer 4 is left in the groove 3 of the semiconductor substrate 1 in substantially flush relation with the major surface of the semiconductor substrate 1. This portion of the CVD-$SiO_2$ layer 4 left in the groove 3 is utilized as an isolation region between elements in a finally fabricated semiconductor device.

Figure 2A:
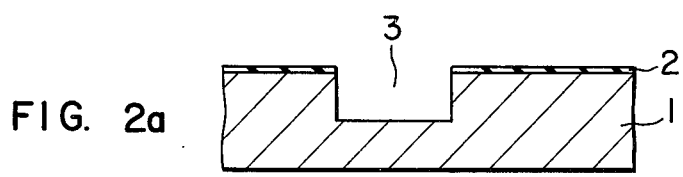
FIGS. 2a to 2e are schematic sectional views of part of a semiconductor substrate showing successive fabricating steps of another embodiment of the present invention.
Figure 2B:
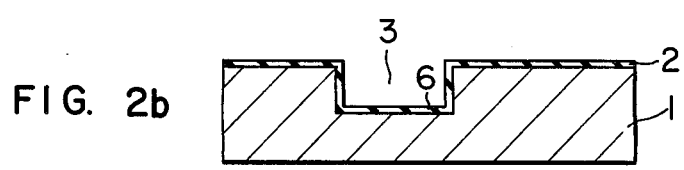
Figure 2C:
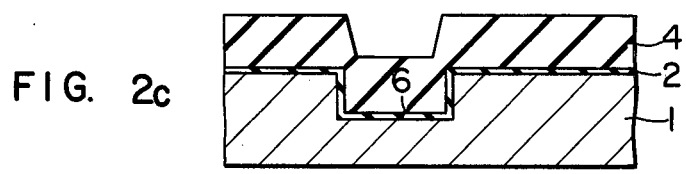
Figure 2D:
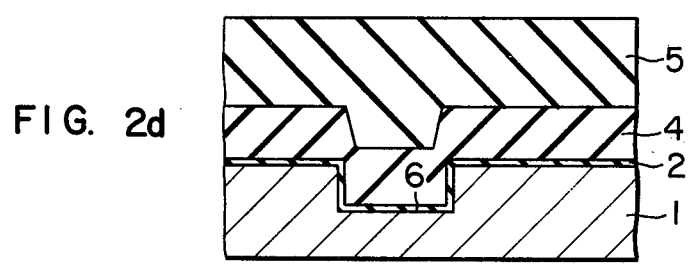
Figure 2E:
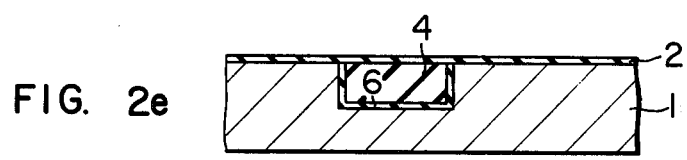

FIGS. 2a to 2e show schematically successive steps of another embodiment of the present invention. Referring to FIG. 2a, a preformed oxide layer 2 is used as a mask for selectively providing a groove 3 in one major surface of a semiconductor substrate 1 as in FIG. 1a. Then, as shown in FIG. 2b, thermal oxidation is applied to the groove 3 to form an oxide layer 6 within the groove 3. Subsequently, an $SiO_2$ layer 4 is deposited by the aforementioned chemical vapor deposition (CVD) to cover the substrate surface and to fill the groove 3 as shown in FIG. 2c, and a PIQ resin layer 5 is deposited on the CVD-$SiO_2$ layer 4 so as to make the entire top surface of the PIQ resin layer parallel to the major surface of the substrate as shown in FIG. 2d. The PIQ resin layer 5 and the CVD-$SiO_2$ layer 4 are then etched away from the side of the surface of the PIQ resin layer 5 by rf sputtering as described in the first embodiment to leave a portion of the $SiO_2$ layer 4 in the groove 3 as shown in FIG. 2e. Thus, the portion of the $SiO_2$ layer 4 left selectively in the groove 3 has a flat surface substantially flush with the major surface of the semiconductor substrate 1.

Figure 3A:
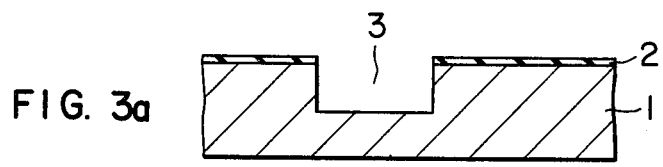
FIGS. 3a and 3b are schematic sectional views of part of a semiconductor substrate showing part of successive fabricating steps of still another embodiment of the present invention.
Figure 3B:
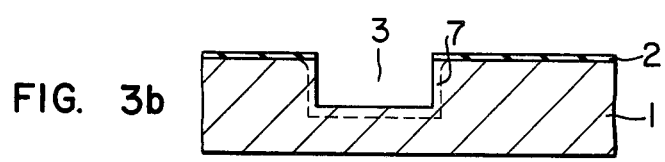

FIGS. 3a and 3b show schematically part of successive steps of still another embodiment of the present invention. Referring to FIG. 3a, a groove 3 is selectively provided in one major surface of a semiconductor substrate 1 using a preformed oxide layer 2 as a mask as in the first and second embodiments. Then as shown in FIG. 3b, a channel stopper region (P type high impurity region) 7 is formed in the groove 3 as by thermal diffusion or ion implantation. Subsequently, steps as shown in FIGS. 1b to 1d or FIGS. 2c and 2d are employed to selectively provide an isolation region of electrical insulator in the groove 3 of the semiconductor substrate 1.

FIGS. 4a to 4h show schematically an application of a further embodiment of the present invention to the fabrication of a bipolar type semiconductor integrated circuit device.

Figure 4A:
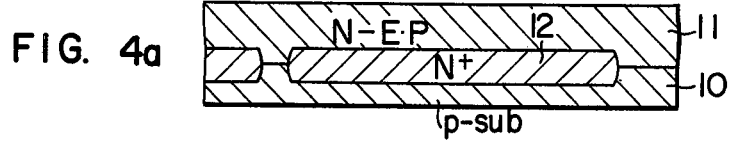
FIGS. 4a to 4h are schematic sectional views of part of a semiconductor substrate showing successive steps of a further embodiment of the present invention when applied to the fabrication of a bipolar type semiconductor integrated circuit divice.
Figure 4B:
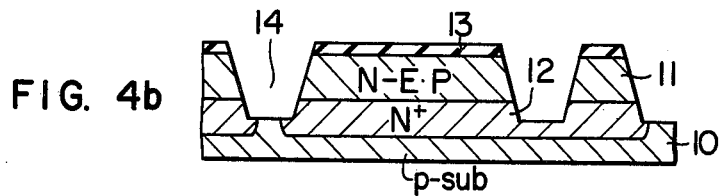

Referring to FIG. 4a, an N+-type buried layer 12 is selectively formed or embedded in one major surface of a semiconductor substrate 10 of P-type silicon, and an N-type epitaxial layer 11 is then grown all over the surface of the embedded N+-type layer 12 and the remaining portions of the major surface of the semiconductor substrate 10. Then, as shown in FIG. 4b, the N-type epitaxial layer 11 is selectively etched through a mask 13 of suitable material thereby providing a groove 14 which extends into the embedded N+-type layer 12.

Figure 4C:
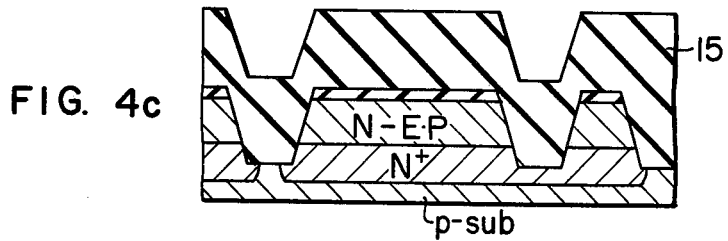
Figure 4D:
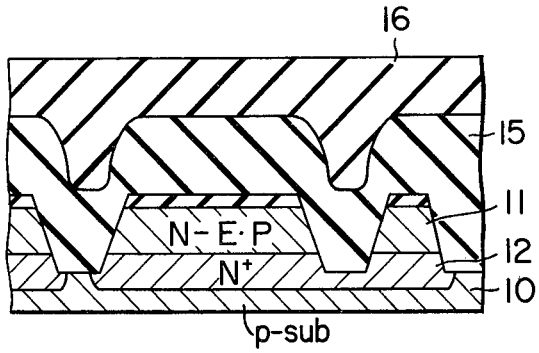
Figure 4E:
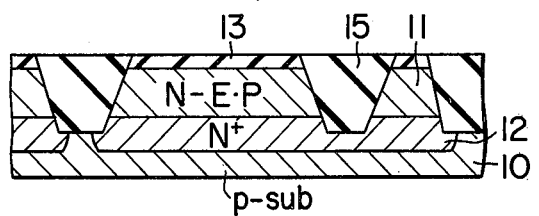

Subsequently, an SiO$_2$ layer 15 is deposited by chemical vapor deposition (CVD) to fill the groove 14 and cover the N-type epitaxial layer 11 as shown in FIG. 4c. A layer 16 of PIQ resin is then coated on the CVD-SiO$_2$ layer 15 as shown in FIG. 4d. The PIQ resin layer 16 and the CVD-SiO$_2$ layer 15 are then removed by applying rf sputtering, plasma etching or the like from the side of the surface of the PIQ resin layer 16 to leave a portion of the CVD-SiO$_2$ layer 15 in the groove 14 as shown in FIG. 4e. Thus, the portion of the CVD-SiO$_2$ layer 15 left in the groove 14 has a flat surface substantially flush with the surface of the N-type epitaxial layer 11.

Figure 4F:
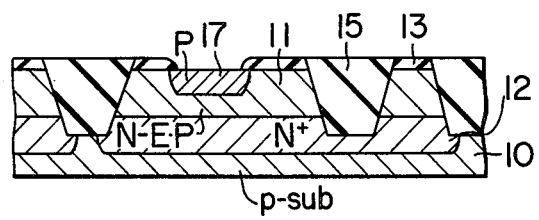
Figure 4G:
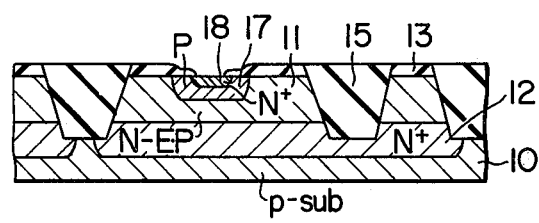
Figure 4H:
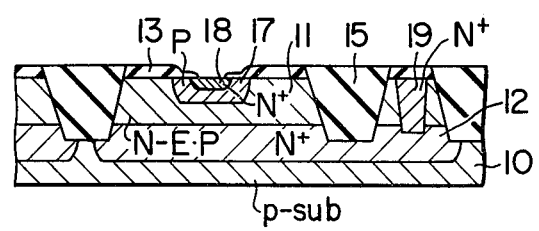

Then, as shown in FIG. 4f, a P-type base region 17 is formed in the N-type epitaxial layer 11 by diffusion, and then as shown in FIG. 4g, an N+-type emitter region 18 is formed in the P-type base region 17 by diffusion. In the final step, a collector contact region 19 is formed in a zone as shown in FIG. 4h, and a semiconductor integrated circuit device is finally completed after depositing electrodes and wiring connected to the N+-type emitter region 18, P-type base region 17 and N+-type collector contact region 19. The resultant device is packaged within a resin envelope or can.

Although the aforementioned embodiments have referred to the use of the PIQ resin as an auxiliary material to be etched after being deposited on the CVD-SiO$_2$ layer, any other suitable material such as SOG (Spin-on-Glass), photoresist or Si$_3$N$_4$ may be employed in lieu of the PIQ resin. The inventors have experimentally confirmed that the rate of etching of layers of PIQ resin, photoresist, SiO$_2$ and Si$_3$N$_4$ is about 1000A per minute when they are etched by rf sputtering under the conditions of Ar 20cc/min and $5 \times 10^{-3}$ Torr.

Further, although the aforementioned embodiments have referred to etching by rf-sputtering as one form of physical etching using ions, any other suitable form such as plasma etching may be employed in lieu of the rf sputtering.

In the aforementioned embodiments, the step of etching of the PIQ resin layer and the CVD-SiO$_2$ layer deposited on the preformed oxide layer covering the surface of the substrate has been such that the PIQ resin layer and the CVD-SiO$_2$ layer are removed at least to expose the oxide layer covering the substrate surface. However, those skilled in the art will readily understand that the preformed oxide layer and a portion of the substrate surface may be removed together with these layers, and then, a new oxide layer may be deposited on the thus exposed substrate surface.

It will be understood from the foregoing description that the present invention eliminates objectionable thermal distortion of the semiconductor substrate of silicon due to exposure to excessive heat, since the oxide filling the groove of the semiconductor substrate is deposited at a low temperature. According to the present invention, the SiO$_2$ layer deposited on the semiconductor substrate to fill the groove of the substrate is etched at a rate approximately equivalent to that of the PIQ resin layer deposited on the SiO$_2$ layer, and thus, the surface of the portion of the SiO$_2$ layer finally left in the groove of the substrate is substantially flush with the surface of the substrate. The present invention is therefore advantageous in that wiring of aluminum or like conductive material can be uniformly and continuously deposited on the flat substrate surface thereby obviating prior art troubles including disconnection of wiring.

It is apparent that the present invention is in no way limited to the aforementioned specific embodiments and is equally effectively applicable to the fabrication of MOS type semiconductor integrated circuit devices, bipolar MOS type semiconductor devices, diode arrays and various other semiconductor devices.

We claim:

1. A method of fabricating a bipolar type semiconductor integrated circuit device, comprising the steps of:
   (a) selectively forming an embedded N+-type layer in one major surface of a substrate of P-type silicon;
   (b) growing an N-type epitaxial layer all over the surface of said embedded N+-type layer and said P-type silicon substrate;
   (c) selectively etching said N-type epitaxial layer through a mask of suitable material to provide a groove which extends into said N+-type layer;
   (d) depositing an SiO$_2$ layer by chemical vapor deposition to cover said N-type epitaxial layer and to fill said groove;
   (e) coating said CVD-SiO$_2$ layer with a layer of PIQ resin;
   (f) applying rf sputtering from the side of the surface of said PIQ resin layer to remove by etching said PIQ resin layer and said CVD-SiO$_2$ layer to leave in said groove a portion of said CVD-SiO$_2$ layer having a flat surface extending flush with the surface of said mask thereby providing an isolation region;
   (g) forming a P-type base region in said N-type epitaxial layer by diffusion;
   (h) forming an N+-type emitter region in said P-type base region by diffusion;
   (i) forming an N+-type collector contact region in the portion of said N-type epitaxial layer external to and spaced apart by said isolation region from the portion of said N-type epitaxial layer in which said P-type base region and said N+-type emitter region are formed;
   (j) depositing electrodes in contact with said N+-type emitter region, said P-type base region and said N+-type collector contact region respectively; and
   (k) sealing the resultant device with a suitable resin.

* * * * *